(12) United States Patent
Chen

(10) Patent No.: US 10,319,748 B2
(45) Date of Patent: Jun. 11, 2019

(54) DISTRIBUTION OF TFT COMPONENTS IN LTPS PROCESS

(71) Applicant: Wuhan China Star Optoelectronics Technology Co., Ltd., Wuhan, Hubei (CN)

(72) Inventor: Chen Chen, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/523,001

(22) PCT Filed: Mar. 14, 2017

(86) PCT No.: PCT/CN2017/076582
§ 371 (c)(1),
(2) Date: Jul. 18, 2018

(87) PCT Pub. No.: WO2018/152888
PCT Pub. Date: Aug. 30, 2018

(65) Prior Publication Data
US 2018/0323217 A1    Nov. 8, 2018

(30) Foreign Application Priority Data

Feb. 22, 2017   (CN) .......................... 2017 1 0096147

(51) Int. Cl.
*H01L 27/12*    (2006.01)
*H01L 27/02*    (2006.01)
(Continued)

(52) U.S. Cl.
CPC ...... *H01L 27/124* (2013.01); *G02F 1/136286* (2013.01); *H01L 27/0207* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 2009/0027325 A1* | 1/2009 | Kim .................. | G02F 1/136286 345/92 |
| 2014/0168045 A1* | 6/2014 | Jiang .................... | H01L 27/124 345/92 |

(Continued)

*Primary Examiner* — Mamadou L Diallo

(57) ABSTRACT

Disclosed is a distribution of TFT components in the LTPS process. A pair of parallel data lines are arranged between an $i^{th}$ and $(i+1)^{th}$ rows of pixels. Each pair of data lines includes a first data line and a second data line. Two adjacent pixels of the $i^{th}$ row are respectively connected to the first data line and the second data line through corresponding U-shaped TFT components. Two pixels of the $(n+1)^{th}$ row corresponding to the two above adjacent pixels are respectively connected to the second data line and the first data line through corresponding U-shaped TFT components. The U-shaped TFT component of the pixel of the $i^{th}$ row and the U-shaped TFT component of the corresponding pixel of the $(i+1)^{th}$ row are disposed with openings thereof facing and staggered with each other. An aperture ratio of a product can be effectively increased by the staggered setting of the U-shaped TFT components. The use of such setting can realize dot inversion in the case of column inversion and reduce the power consumption of the product.

10 Claims, 3 Drawing Sheets

(51) Int. Cl.
*G02F 1/1362* (2006.01)
*G02F 1/1335* (2006.01)
*G02F 1/1368* (2006.01)

(52) U.S. Cl.
CPC ........ H01L 27/1222 (2013.01); *G02F 1/1368* (2013.01); *G02F 1/133512* (2013.01)

(56) References Cited

U.S. PATENT DOCUMENTS

| | | | |
|---|---|---|---|
| 2016/0116813 A1* | 4/2016 | Mochizuki | G02F 1/136286 349/138 |
| 2017/0293172 A1* | 10/2017 | Zhang | G02F 1/1368 |
| 2018/0157071 A1* | 6/2018 | Wang | G02F 1/1339 |
| 2018/0308863 A1* | 10/2018 | Chen | G02F 1/133753 |

* cited by examiner

US 10,319,748 B2

DISTRIBUTION OF TFT COMPONENTS IN LTPS PROCESS

CROSS-REFERENCE TO RELATED APPLICATIONS

The present application claims the priority of Chinese patent application 201710096147.9, entitled "Distribution of TFT components in LTPS process" and filed on Dec. 26, 2017, the entirety of which is incorporated herein by reference.

FIELD OF THE INVENTION

The present disclosure relates to a TFT structure in the technical field of liquid crystal displays, and in particular, to a TFT structure in LTPS process.

BACKGROUND OF THE INVENTION

In the manufacture of display panels, aperture ratio is an issue that every product design team must consider while designing every product. Aperture ratio refers to the ratio of an area of a light-transmitting portion of a sub-pixel (i.e., an area of the sub-pixel excluding areas occupied by a wiring portion and a transistor portion which are usually hidden by a black matrix) to a total area of the sub-pixel. The higher the aperture ratio is, the higher the efficiency of light transmitting is. When light is emitted from a backlight, not all the light can pass through the panel; some of the light is prevented by elements such as signal wirings for a LCD source driver chip and a gate driver chip, and a TFT, as well as a storage capacitor for storing voltage. These elements are not completely transparent. Light travels through these elements, which is not controlled by voltage and cannot display a correct gray scale, so black matrix is used to shield these elements to prevent interference with other light transmitting areas. The ratio of the effective light transmitting area to the total area is called aperture ratio. Various factors such as pattern design of pixels (in a pixel display device or television image) and arrangement of various metal wires can greatly affect the aperture ratio of a final product.

FIG. 1 shows a shape and a layout of TFTs in traditional LTPS process. Two parallel data lines are arranged between two adjacent columns of pixels. The data lines comprise a first data line 21 and a second data line 22. The two adjacent pixels in each column are respectively connected to the first data line 21 through a U-shaped TFT1 and to the first data line 21 through a U-shaped TFT2. The TFTs of the two pixels of the adjacent column corresponding to the above two pixels are respectively connected to the second data line 22. Voltages of the first data line and the second data to line may be positive, and this display mode is frame inversion. The voltages of the first data line and the second data line can be reversed: one is positive and the other is negative, so that one of the two adjacent columns of pixels is positive while the other is negative, and this display mode is called column inversion.

In addition, in the manufacture of the display panel, since the picture flicker phenomenon is the slightest with the use of dot inversion when the pictures are being switched, people tend to use dot inversion as the image display mode. However, in order to achieve the effect of dot inversion, the power consumption of the panel is very high, which reduces the competitiveness of the product in the market. Therefore, the lower power consuming column inversion is usually used as the inversion mode in the display of products.

SUMMARY OF THE INVENTION

The present disclosure aims to overcome the defects of high power consumption of a dot inversion panel in the prior art and low competitiveness of the panel in the market and to provide a distribution for TFTs with low power consumption and increased aperture ratio, which achieves display effect of dot inversion in a column inversion display mode.

The object of the present disclosure is achieved by the following technical solutions.

The present disclosure provides a distribution of TFT components in LTPS process. A pair of parallel data lines are arranged between an $i^{th}$ and $(i+1)^{th}$ rows of pixels. Each pair of data lines comprises a first data line and a second data line. Two adjacent pixels of the $i^{th}$ row are respectively connected to the first data line and the second data line through corresponding U-shaped TFT components. Two pixels of the $(n+1)^{th}$ row corresponding to the above two adjacent pixels of the $(n+1)^{th}$ row are respectively connected to the second data line and the first data line through corresponding U-shaped TFT components. The U-shaped TFT component of the pixel of the $i^{th}$ row and the U-shaped TFT component of the corresponding pixel of the $(i+1)^{th}$ row are disposed with openings thereof facing and staggered with each other, and the TFT components each are made to conduct by a gate line. A source of the U-shaped component is connected to a corresponding data line.

According to the distribution of TFT components in the LTPS process, a source of the U-shaped component is connected to a corresponding data line.

According to the distribution of TFT components in the LTPS process, a voltage of the first data line is positive, and a voltage of the second data line is negative.

According to the distribution of TFT components in the LTPS process, an electrode of the pixel with the U-shaped component thereof connected to the first data line is negative, and an electrode of the pixel with the U-shaped component thereof connected to the second data line is positive.

According to the distribution of TFT components in the LTPS process, each of the gate lines surrounds two pixels of each column between each two adjacent pairs of data lines in an S-shaped pattern.

According to the distribution of TFT components in the LTPS process, a black matrix is arranged around each of the pixels. The gate lines coincide with the black matrix disposed between each pair of data lines in a horizontal direction, and coincide with the black matrix disposed between two adjacent pairs of data lines and perpendicular to the two pairs of data lines in a vertical direction.

According to the distribution of TFT components in the LTPS process, the gate lines are arranged between a double data line layer and a semiconductor layer where the TFT components are located.

According to the distribution of TFT components in the LTPS process, each of the pixels respectively corresponds to one U-shaped TFT component.

According to the distribution of TFT components in the LTPS process 1, each of the TFT components of the $(i+1)$th row controls a pixel where a corresponding TFT component in the $i^{th}$ row is located.

According to the distribution of TFT components in the LTPS process, each column of the TFT components is electrically connected to one gate line.

The present disclosure has the following advantages. The aperture ratio of the product can be effectively increased by the staggered setting of the U-shaped TFTs.

A signal fed to the first data line during a first frame is negative while a signal fed to the first data line during a second frame is positive, and column inversion is used as the display mode. However, polarities of the two adjacent pixels are opposite, so that the display effect of dot inversion is achieved. In this way, the display quality of the product is improved. The use of the method can realize dot inversion in the case of column inversion and reduce the power consumption of the product.

BRIEF DESCRIPTION OF THE DRAWINGS

The present disclosure will be described hereinafter in more detail based on embodiments and with reference to the accompanying drawings. In the drawings.

Figure 1:
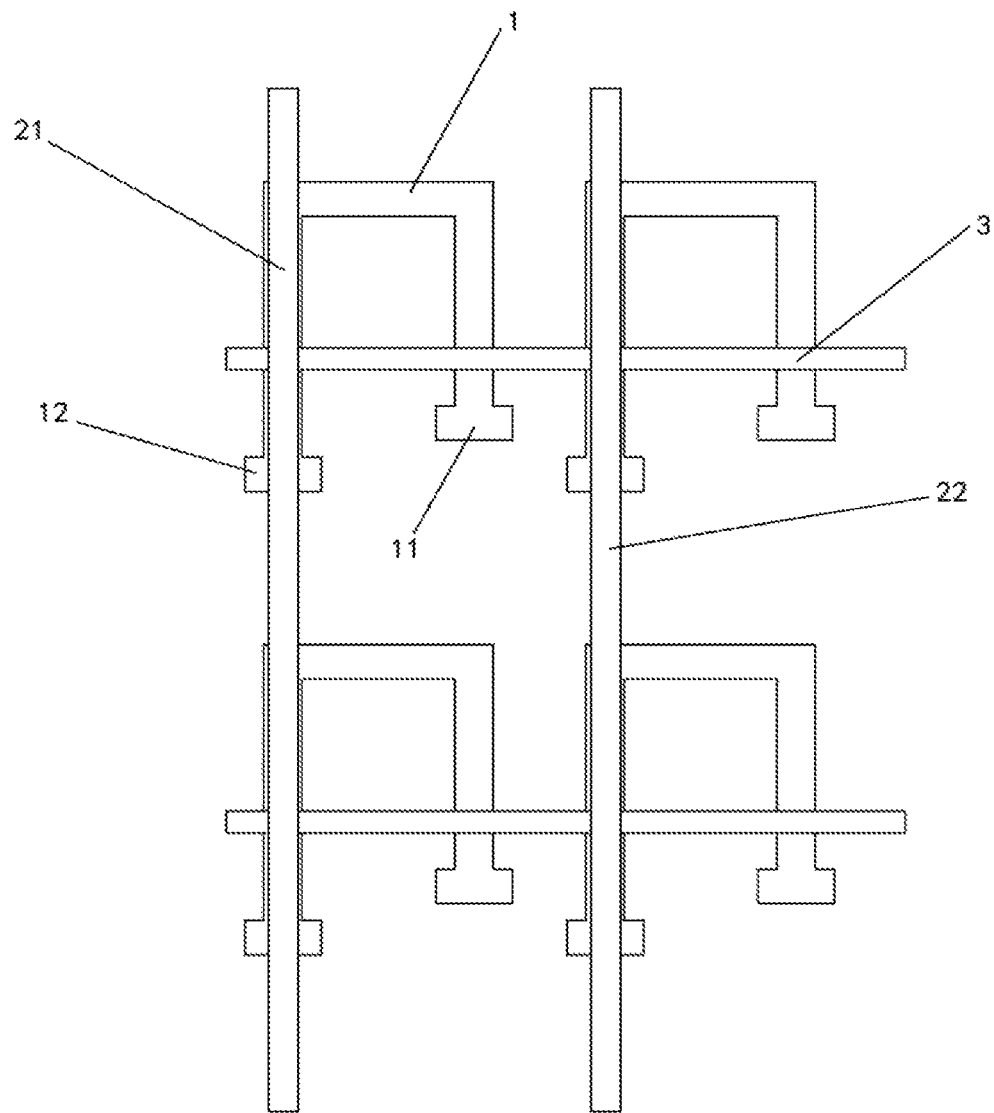
FIG. 1 schematically shows distribution of TFT components in traditional LTPS process.

In the drawings, same components are indicated with same reference signs. The figures are not drawn in accordance with an actual scale.

DETAILED DESCRIPTION OF THE EMBODIMENTS

The present disclosure will be further explained in detail in connection with the accompanying drawings.

Figure 2:
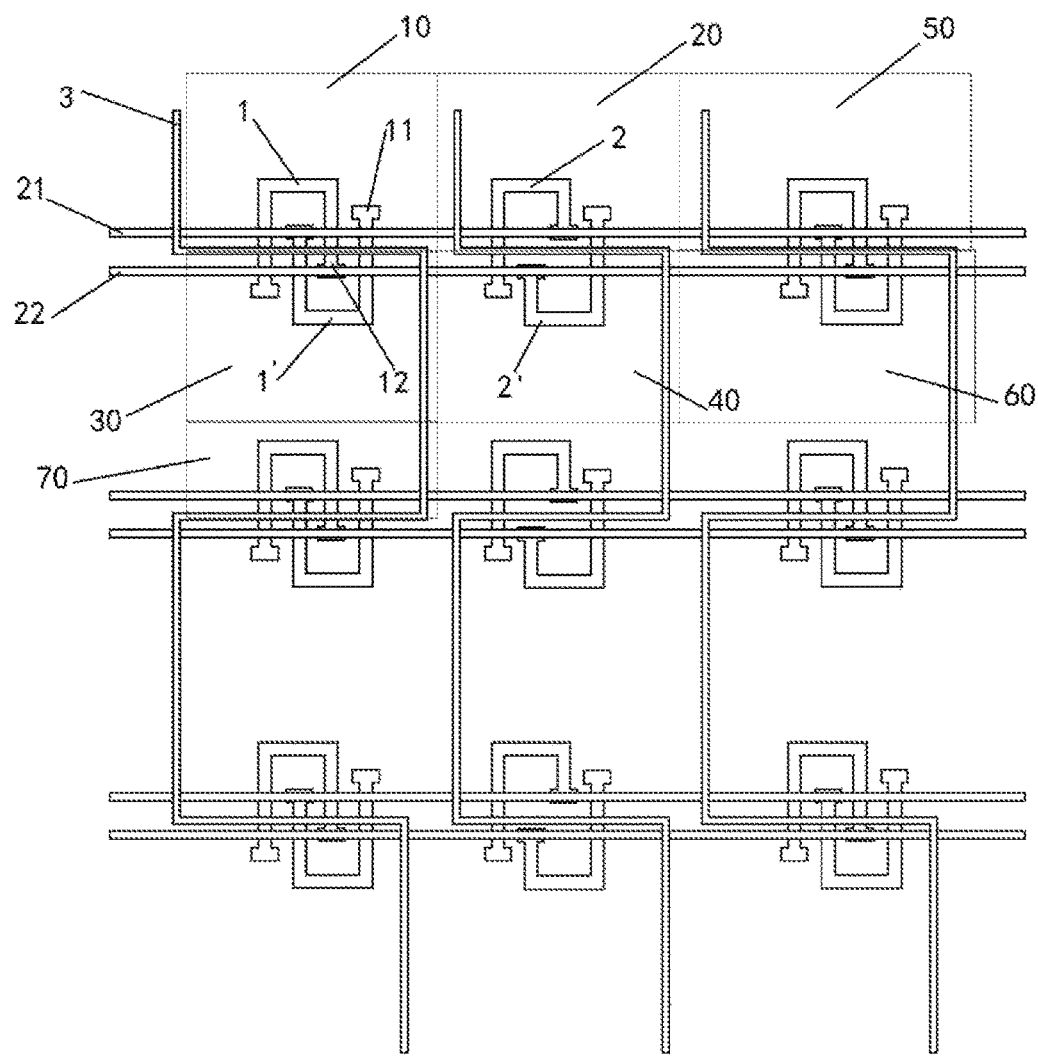
FIG. 2 schematically shows distribution of TFT components in LTPS process of the present disclosure.

FIG. 2 schematically shows distribution of TFT components in LTPS process of the present disclosure. A display panel comprises a plurality of rows of pixels. A pair of parallel data lines are arranged between pixels of an $i^{th}$ row and pixels of an $(i+1)^{th}$ row. The data lines comprise a first data line 21 and a second data line 22. Two adjacent pixels 10 and 20 of the $i^{th}$ row are respectively connected to the first data line 21 and the second data line 22 through a U-shaped TFT component 1' and a U-shaped TFT component 2', and two pixels 30 and 40 of the $(n+1)^{th}$ row corresponding to the two above mentioned pixels 10 and 20 are respectively connected to the second data line 22 and the first data line 21 through a U-shaped TFT component 1' and a U-shaped TFT component 2. The U-shaped TFT component 1 of the pixel of the $i^{th}$ row and the U-shaped TFT component 1' of the corresponding pixel of the $(i+1)^{th}$ row are disposed with openings thereof facing and staggered with each other.

The U-shaped TFT component 1 comprises a drain 11 and a source 12, and the source 12 is connected to the data line. The drain 11 is used to transfer a signal to the interior of the pixel.

The U-shaped TFT is not transparent in an inner part of the opening. In the conventional TFT arrangement, this part is not effectively used, resulting in poor aperture ratio of the display panel. In the present disclosure, the two U-shaped components are disposed with the openings thereof facing and staggered with each other. The source of one U-shaped TFT component is arranged inside the opening of the other U-shaped TFT component, by means of which the inner part of the opening of the U-shaped component is effectively used and an area of other transparent parts of the pixels occupied by the U-shaped component is reduced, and thus the aperture ratio of the product is increased.

The TFT components each are made to conduct by means of a gate line 3. The gate lines are used to enable the TFT components to conduct so that the TFTs can conduct electricity. Each of the TFT components is made to conduct by means of one gate line and each TFT component is connected to one gate line.

A voltage of the first data line 21 is positive, and a voltage of the second data line 22 is negative.

An electrode of the pixel 10 with the U-shaped component 1 connected to the first data line 21 is negative; an electrode of the pixel 30 with the U-shaped component 1' connected to the second data line 22 is positive.

The pixel 20 is adjacent to the pixel 10, and the U-shaped component 2 thereof is connected to the first data line 21. An electrode of the pixel 20 is negative. An electrode of the pixel 40 with the U-shaped TFT component 2' connected to the second data line 22 is positive.

Similarly, an electrode of the pixel 50 is positive, and an electrode of the pixel 60 is negative.

The pixel 10 is controlled by the U-shaped TFT component 1', and the pixel 20 is controlled by the U-shaped TFT component 2'; the pixel 30 is controlled by the U-shaped TFT component 1; and the pixel 40 is controlled by the U-shaped TFT component 2. In other words, the pixels of the $i^{th}$ row are controlled by the U-shaped TFT components in the $(i+1)^{th}$ rows of pixels, and the pixels of the $(i+1)^{th}$ row are controlled by the U-shaped TFT components of the $i^{th}$ row of pixels.

That is, a signal fed to the first data line during a first frame is negative while a signal fed to the first data line during a second frame is positive, and the column inversion is used as the display mode. However, the polarities of two adjacent pixels on the first data line are opposite, so that the display effect of dot inversion is achieved. In this manner, the display quality of the product is improved.

The voltage of the first data line 21 may also be configured to be negative, while the voltage of the second data line is configured to be positive, so that the electrode of the pixel with the U-shaped TFT component connected to the first data line is positive, and the electrode of the pixel with the U-shaped TFT component connected to the second data line is negative. That is, the voltage polarity of any pixel is opposite to those of the adjacent upper, lower, left and right pixels. In this way, the display effect of dot inversion is obtained, and the display quality of the product is thus improved.

A strip of black matrix is arranged around each pixel for blocking light. Therefore during the TFT design in LTPS process, the gate line 3 is arranged at a region which is coincident with the black matrix. This can help to reduce the light-transmission area of the pixels occupied by the gate lines and avoid effect on aperture ratio.

Each column of pixels is surrounded by the gate lines 3 in an S-shaped pattern. The gate lines 3 are arranged in a horizontal direction and a vertical direction. In the horizontal direction, the gate lines 3 coincide with the black matrix disposed between the two data lines, while in the vertical direction the gate lines 3 coincide with the black matrix on the vertical sides of the two pixels disposed between two adjacent pairs of data lines. That is, each of gate lines 3 surrounds two adjacent sides of each pixel of each column. This arrangement can effectively reduce the light-transmission area of the pixels occupied by the gate lines and increase the aperture ratio.

Figure 3:
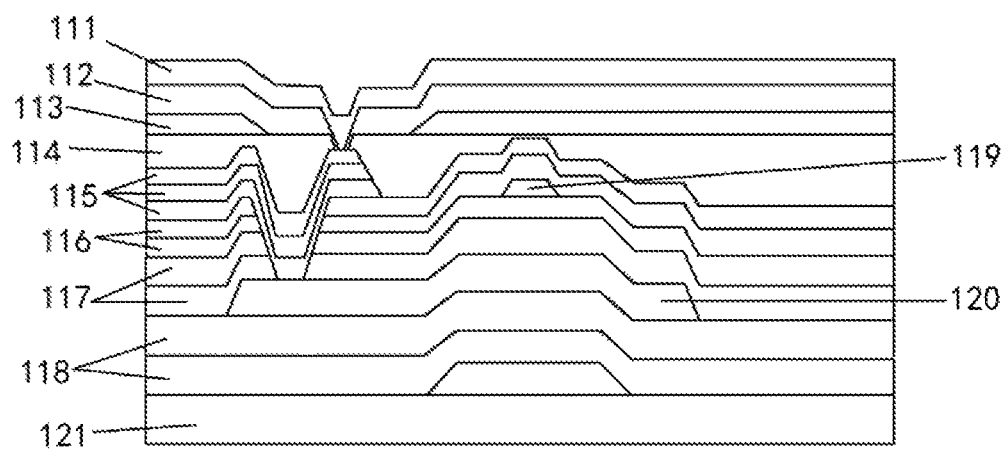
FIG. 3 shows a cross-sectional view of distribution of TFT components in LTPS process of the present disclosure.

FIG. 3 is a cross-sectional view of distribution of TFT components in LTPS process of the present disclosure, an array substrate comprises a first ITO 111, a passivation layer 112, a second ITO 113, a planarization layer 114, a data line layer 115, a dielectric layer 116, a gate line 119, an insulating layer 117, a TFT semiconductor layer 120 and a buffer layer 118 disposed on a glass plate 121 from up to down. The data line layer 115, the insulating layer 117 and the dielectric layer 116 may be disposed according to needs of different products. The data line layer 115 is respectively contacted with the polysilicon layer 120, the planarization layer 114, the first ITO layer 111 and the second ITO layer 113.

The gate line layer 119 is provided between the data line layer 115 and the semiconductor layer 120 without contacting them.

Openings of the gate lines surrounding the pixels between every two adjacent pairs of data lines are opposite.

Each of the pixels functions by way of a TFT component, and each of the two opposite U-shaped TFTs occupies one pixel.

According to the distribution of TFT components in LTPS process, each TFT component of the $(i+1)^{th}$ row controls the pixel where the corresponding TFT component of the $i^{th}$ row is located. That is, the TFT component 1' controls the pixel 10, the TFT component 1 controls the pixel 30, the TFT component 2' controls the pixel 20, and TFT component 2 controls the pixel 40.

Each column of the TFT components is electrically connected to one gate line.

The present disclosure is explained in detail in combination with preferred embodiments hereinabove, but the embodiments disclosed herein can be improved or substituted with the equivalents without departing from the protection scope of the present disclosure. In particular, as long as there are no structural conflicts, the technical features disclosed in each and every embodiment of the present disclosure can be combined with one another in any way, and the combined features formed thereby are within the protection scope of the present disclosure. The present disclosure is not limited by the specific embodiments disclosed herein, but includes all technical solutions falling into the protection scope of the claims.

The invention claimed is:

1. Distribution of TFT components in an LTPS process, wherein a pair of parallel data lines are arranged between an $i^{th}$ and $(i+1)^{th}$ rows of pixels;
    each pair of data lines comprises a first data line and a second data line;
    two adjacent pixels of the $i^{th}$ row are respectively connected to the first data line and the second data line through corresponding U-shaped TFT components;
    two pixels of the $(n+1)^{th}$ row corresponding to the above two adjacent pixels of the $(n+1)^{th}$ row are respectively connected to the second data line and the first data line through corresponding U-shaped TFT components;
    the U-shaped TFT component of the pixel of the $i^{th}$ row and the U-shaped TFT component of the corresponding pixel of the $(i+1)^{th}$ row are disposed with openings thereof facing and staggered with each other; and
    the TFT components each are made to conduct by a gate line.

2. Distribution of TFT components in the LTPS process according to claim 1, wherein a source of the U-shaped component is connected to a corresponding data line.

3. Distribution of TFT components in the LTPS process according to claim 1, wherein a voltage of the first data line is positive, and a voltage of the second data line is negative.

4. Distribution of TFT components in the LTPS process according to claim 3, wherein an electrode of the pixel with the U-shaped component thereof connected to the first data line is negative, and an electrode of the pixel with the U-shaped component thereof connected to the second data line is positive.

5. Distribution of TFT components in the LTPS process according to claim 1, wherein each of the gate lines surrounds two pixels of each column between each two adjacent pairs of data lines in an S-shaped pattern.

6. Distribution of TFT components in the LTPS process according to claim 5, wherein:
    a black matrix is arranged around each of the pixels, the gate lines coincide with the black matrix disposed between each pair of data lines in a horizontal direction, and coincide with the black matrix disposed between two adjacent pairs of data lines and perpendicular to the two pairs of data lines in a vertical direction.

7. Distribution of TFT components in the LTPS process according to claim 6, wherein the gate lines are arranged between a double data line layer and a semiconductor layer where the TFT components are located.

8. Distribution of TFT components in the LTPS process according to claim 1, wherein each of the pixels respectively corresponds to one U-shaped TFT component.

9. Distribution of TFT components in the LTPS process according to claim 1, wherein each of the TFT components of the $(i+1)^{th}$ row controls a pixel where a corresponding TFT component in the $i^{th}$ row is located.

10. Distribution of TFT components in the LTPS process according to claim 1, wherein each column of the TFT components is electrically connected to one gate line.

* * * * *